United States Patent
Valeri et al.

(10) Patent No.: US 9,793,870 B1
(45) Date of Patent: Oct. 17, 2017

(54) VEHICLE SOUND ENHANCEMENT SYSTEMS AND METHODS FOR VEHICLE DECELERATION

(71) Applicant: GM Global Technology Operations LLC, Detroit, MI (US)

(72) Inventors: Frank C. Valeri, Novi, MI (US); Scott M. Reilly, Southfield, MI (US); Roger C. Barlow, Jr., Brighton, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/245,400

(22) Filed: Aug. 24, 2016

(51) Int. Cl.
- B60K 28/10 (2006.01)
- H03G 3/30 (2006.01)
- B60R 11/02 (2006.01)

(52) U.S. Cl.
CPC ........... H03G 3/30 (2013.01); B60R 11/0217 (2013.01)

(58) Field of Classification Search
CPC ....... H03G 3/30; B60R 11/0217; B60R 11/02; B60R 16/0231; B60R 21/0132; H04R 2499/13
USPC ........................... 180/282; 381/86, 302, 71.4
See application file for complete search history.

(56) References Cited

U.S. PATENT DOCUMENTS

| | | | |
|---|---|---|---|
| 8,155,343 B2 | 4/2012 | Honji et al. | |
| 8,320,581 B2 | 11/2012 | Hera et al. | |
| 8,938,079 B2 | 1/2015 | Valeri et al. | |
| 9,031,248 B2 | 5/2015 | Hera | |
| 9,177,544 B2 | 11/2015 | Hera | |
| 9,271,073 B2 | 2/2016 | Valeri et al. | |
| 9,299,337 B2 | 3/2016 | Hera et al. | |
| 9,311,910 B2 | 4/2016 | Hera | |
| 9,333,911 B2 | 5/2016 | Hera et al. | |
| 9,365,158 B2 | 6/2016 | Barlow, Jr. et al. | |
| 2012/0134504 A1* | 5/2012 | Napoletano | G10K 15/02 381/61 |
| 2013/0177167 A1* | 7/2013 | Takahashi | B60Q 5/008 381/86 |
| 2014/0161276 A1* | 6/2014 | Klier | G10K 15/02 381/86 |
| 2015/0016627 A1 | 1/2015 | Barlow, Jr. et al. | |
| 2016/0016511 A1 | 1/2016 | Mueller | |

OTHER PUBLICATIONS

U.S. Appl. No. 14/851,627, Sep. 11, 2015, Barlow, Jr. et al.
U.S. Appl. No. 15/161,991, May 23, 2016, Valeri.
U.S. Appl. No. 15/245,331, Aug. 24, 2016, Valeri et al.
U.S. Appl. No. 15/245,334, Aug. 24, 2016, Reilly et al.

\* cited by examiner

*Primary Examiner* — Paul S Kim
*Assistant Examiner* — Sabrina Diaz (57) ABSTRACT

An audio system of a vehicle includes a mode module that sets a mode signal to a first mode when a vehicle speed is greater than a predetermined speed and a longitudinal acceleration of the vehicle is less than a predetermined acceleration. The predetermined acceleration is less than zero and the predetermined speed is greater than zero. A sound control module, when the mode signal is in the first mode, selectively sets audio characteristics for a deceleration event of the vehicle based on randomization parameters. An audio driver module, based on the audio characteristics, applies power to speakers to output sound within a passenger cabin of the vehicle.

20 Claims, 6 Drawing Sheets

VEHICLE SOUND ENHANCEMENT SYSTEMS AND METHODS FOR VEHICLE DECELERATION

CROSS-REFERENCE TO RELATED APPLICATIONS

The present disclosure is related to U.S. Pat. No. 8,938,079, issued on Jan. 20, 2015, U.S. Pat. No. 9,271,073, issued on Feb. 23, 2016, U.S. Pat. No. 9,365,158, issued on Jun. 14, 2016, U.S. patent application Ser. No. 14/851,627, filed on Sep. 11, 2015, U.S. patent application Ser. No. 15/161,991, filed on May 23, 2016, U.S. patent application Ser. No. 15/245,334, filed on Aug. 24, 2016, and U.S. patent application Ser. No. 15/245,331, filed on Aug. 24, 2016. The entire disclosures of the applications referenced above are incorporated herein by reference.

FIELD

The present disclosure relates to vehicle audio systems and methods and more particularly to audio control systems and methods for vehicle deceleration events.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some motor vehicles include conventional powertrains having an internal combustion engine and a drivetrain that normally emit sounds during acceleration events, deceleration events, and gear changes. Many consumers have come to rely on these normal sounds as a sign of proper vehicle function. Changes in these normal sounds may indicate, to certain consumers, that the internal combustion engine and/or the drivetrain may be functioning differently than expected.

Some consumers may have expectations as to what the normal sounds of different types of vehicle should be. For example, a consumer may expect certain sounds from "high performance" vehicles, while some sounds may not be expected from other types of vehicles. An absence of expected sounds may detract from a user's enjoyment of a vehicle.

Some motor vehicles include hybrid electric powertrains including an internal combustion engine and one or more electric motors and/or motor generator units (MGUs). Sound produced by hybrid electric powertrains may be different than the sound produced by conventional powertrains.

SUMMARY

In a feature, an audio system of a vehicle is described. A mode module sets a mode signal to a first mode when a vehicle speed is greater than a predetermined speed and a longitudinal acceleration of the vehicle is less than a predetermined acceleration. The predetermined acceleration is less than zero and the predetermined speed is greater than zero. A sound control module, when the mode signal is in the first mode, selectively sets audio characteristics for a deceleration event of the vehicle based on randomization parameters. An audio driver module, based on the audio characteristics, applies power to speakers to output sound within a passenger cabin of the vehicle.

In further features, the mode module sets the mode signal to the first mode when all of: (i) the vehicle speed is greater than the predetermined speed, (ii) the longitudinal acceleration is less than the predetermined acceleration, (iii) fueling of an internal combustion engine is fuel rich, and (vi) a spark timing of the internal combustion engine is retarded relative to a predetermined spark timing.

In further features: the mode module sets the mode signal to a second mode when: (i) the vehicle speed is greater than the predetermined speed; (ii) the longitudinal acceleration is less than the predetermined acceleration; and (iii) at least one of: (a) fueling of the internal combustion engine is cut off; (b) the spark timing is not retarded relative to the predetermined spark timing; and (c) fueling of the internal combustion engine is not fuel rich. The sound control module, when the mode signal is in the second mode, selectively sets the audio characteristics for the deceleration event of the vehicle based on both (i) the randomization parameters and (ii) the mode signal being in the second mode.

In further features, the audio characteristics include at least: a first number of instances to output a first predetermined sound during a predetermined period; and a second number of instances to output a second predetermined sound during the predetermined period. the sound control module determines the first and second numbers based on at least one of the randomization parameters.

In further features a randomization module provides the randomization parameters based on a Chaos function.

In further features, the audio characteristics include at least a total number of predetermined sounds to output per predetermined period and, the sound control module determines the total number of predetermined sounds to output per predetermined period based on at least one of the randomization parameters.

In further features, the audio characteristics include at least a silence period between two successive predetermined sounds, and the sound control module determines the silence period based on at least one of the randomization parameters.

In further features, the audio characteristics include at least a magnitude to output each predetermined sound during a predetermined period, and the sound control module determines the magnitude based on at least one of the randomization parameters.

In further features, the audio characteristics include a number and an order to output two or more predetermined sounds during a predetermined period, and the sound control module determines the number and the order based on at least one of the randomization parameters.

In further features, the two or more predetermined sounds include at least: a first predetermined sound corresponding to one exhaust pressure rise; and a second predetermined sound corresponding to a series of two or more exhaust pressure rises.

In further features, a vehicle audio system is disclosed. At least one memory includes computer executable instructions. At least one processor is configured to read and execute the computer executable instructions, the computer executable instructions cause the at least one processor to: set a mode signal to a first mode when a vehicle speed is greater than a predetermined speed and a longitudinal acceleration of the vehicle is less than a predetermined acceleration, where the predetermined acceleration is less than zero and the predetermined speed is greater than zero; when the mode signal is in the first mode, selectively set audio characteristics for a deceleration event of the vehicle based on randomization parameters; and, based on the audio characteristics, apply power to speakers to output sound within a passenger cabin of the vehicle.

In further features, a non-transitory computer readable medium comprising computer executable instructions is described. The computer executable instructions are configured to cause a processor to perform a method, and the method includes: setting a mode signal to a first mode when a vehicle speed is greater than a predetermined speed and a longitudinal acceleration of the vehicle is less than a predetermined acceleration, where the predetermined acceleration is less than zero and the predetermined speed is greater than zero; when the mode signal is in the first mode, selectively setting audio characteristics for a deceleration event of the vehicle based on randomization parameters; and, based on the audio characteristics, applying power to speakers to output sound within a passenger cabin of the vehicle.

In further features, setting the mode signal to the first mode includes setting the mode signal to the first mode when all of: (i) the vehicle speed is greater than the predetermined speed; (ii) the longitudinal acceleration is less than the predetermined acceleration; (iii) fueling of an internal combustion engine is fuel rich; and (vi) a spark timing of the internal combustion engine is retarded relative to a predetermined spark timing.

In further features, the method further includes: (A) setting the mode signal to a second mode when: (i) the vehicle speed is greater than the predetermined speed; (ii) the longitudinal acceleration is less than the predetermined acceleration; and (iii) at least one of: (a) fueling of the internal combustion engine is cut off; (b) the spark timing is not retarded relative to the predetermined spark timing; and (c) fueling of the internal combustion engine is not fuel rich; and (B) when the mode signal is in the second mode, selectively setting the audio characteristics for the deceleration event of the vehicle based on both (i) the randomization parameters and (ii) the mode signal being in the second mode.

In further features, the audio characteristics include at least: a first number of instances to output a first predetermined sound during a predetermined period; and a second number of instances to output a second predetermined sound during the predetermined period. The method further includes determining the first and second numbers based on at least one of the randomization parameters.

In further features, the method further includes obtaining the randomization parameters based on a Chaos function.

In further features, the audio characteristics include at least a total number of predetermined sounds to output per predetermined period. The method further includes determining the total number of predetermined sounds to output per predetermined period based on at least one of the randomization parameters.

In further features, the audio characteristics include at least a silence period between two successive predetermined sounds. The method further includes determining the silence period based on at least one of the randomization parameters.

In further features, the audio characteristics include at least a magnitude to output each predetermined sound during a predetermined period. The method further includes determining the magnitude based on at least one of the randomization parameters.

In further features, the audio characteristics include a number and an order to output two or more predetermined sounds during a predetermined period. The method further includes determining the number and the order based on at least one of the randomization parameters.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Internal combustion engines of vehicles combust air and fuel within cylinders. During vehicle deceleration at positive vehicle speeds, the engine may emit natural sounds, such as pops and burbles when fuel combusts within an exhaust system of the vehicle. An engine control module (ECM), however, may cut off fueling of one or more cylinders during deceleration. The ECM may cut off fuel to one, more than one, or all of the cylinders of the engine during deceleration, for example, to decrease fuel consumption.

According to the present disclosure, an audio control module of the vehicle outputs sound within a passenger cabin of the vehicle via one or more speakers during a deceleration event to replicate the natural pop and burble sounds of the engine. The audio control module outputs pop and burble sounds randomly based on a randomization function, such as a double pendulum Chaos function. This aurally provides the driver with the expected pop and burble sounds during deceleration in a random way to replicate the random nature of the pop and burble sounds that an engine may produce.

Figure 1:
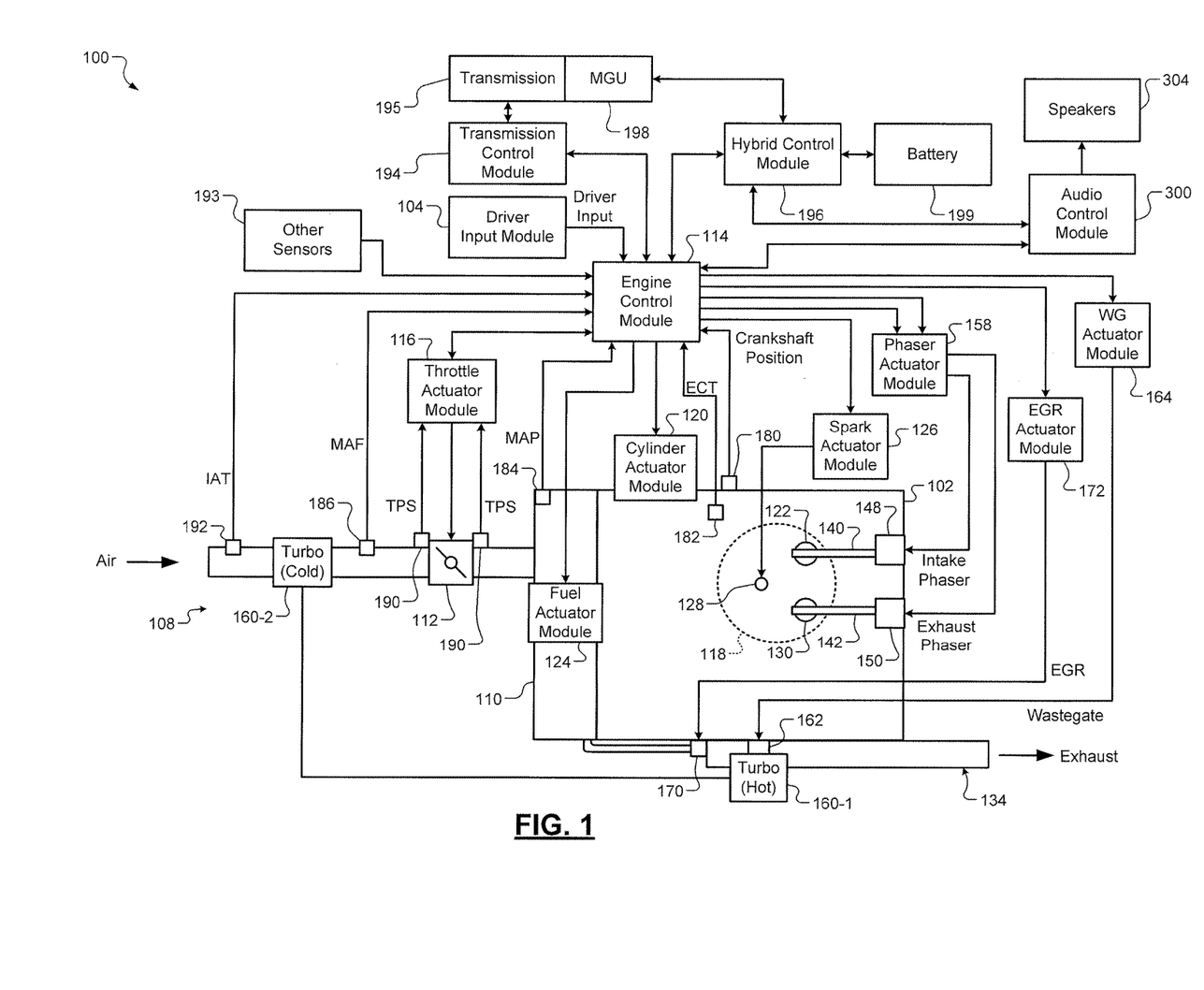
FIG. 1 is a functional block diagram of an example powertrain system of a vehicle.

Referring now to FIG. 1, a functional block diagram of an example powertrain system 100 is presented. The powertrain system 100 of a vehicle includes an engine 102 that combusts an air/fuel mixture to produce torque. The vehicle may be non-autonomous or autonomous.

Air is drawn into the engine 102 through an intake system 108. The intake system 108 may include an intake manifold 110 and a throttle valve 112. For example only, the throttle valve 112 may include a butterfly valve having a rotatable blade. An engine control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 includes multiple cylinders, for illustration purposes a single representative cylinder 118 is shown. For example only, the engine 102 may include 2, 3, 4, 5, 6, 8, 10, and/or 12 cylinders. The ECM 114 may instruct a cylinder actuator module 120 to selectively deactivate some of the cylinders under some circumstances, as discussed further below, which may improve fuel efficiency.

The engine 102 may operate using a four-stroke cycle or another suitable engine cycle. The four strokes of a four-stroke cycle, described below, will be referred to as the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes. For four-stroke engines, one engine cycle may correspond to two crankshaft revolutions.

When the cylinder 118 is activated, air from the intake manifold 110 is drawn into the cylinder 118 through an intake valve 122 during the intake stroke. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers/ports associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. The engine 102 may be a compression-ignition engine, in which case compression causes ignition of the air/fuel mixture. Alternatively, the engine 102 may be a spark-ignition engine, in which case a spark actuator module 126 energizes a spark plug 128 in the cylinder 118 based on a signal from the ECM 114, which ignites the air/fuel mixture. Some types of engines, such as homogenous charge compression ignition (HCCI) engines may perform both compression ignition and spark ignition. The timing of the spark may be specified relative to the time when the piston is at its topmost position, which will be referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with the position of the crankshaft. The spark actuator module 126 may disable provision of spark to deactivated cylinders or provide spark to deactivated cylinders.

During the combustion stroke, the combustion of the air/fuel mixture drives the piston down, thereby driving the crankshaft. The combustion stroke may be defined as the time between the piston reaching TDC and the time when the piston returns to a bottom most position, which will be referred to as bottom dead center (BDC).

During the exhaust stroke, the piston begins moving up from BDC and expels the byproducts of combustion through an exhaust valve 130. The byproducts of combustion are exhausted from the vehicle via an exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118). While camshaft based valve actuation is shown and has been discussed, camless valve actuators may be implemented. While separate intake and exhaust camshafts are shown, one camshaft having lobes for both the intake and exhaust valves may be used.

The cylinder actuator module 120 may deactivate the cylinder 118 by disabling opening of the intake valve 122 and/or the exhaust valve 130. The time when the intake valve 122 is opened may be varied with respect to piston TDC by an intake cam phaser 148. The time when the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. In various implementations, cam phasing may be omitted. Variable valve lift (not shown) may also be controlled by the phaser actuator module 158. In various other implementations, the intake valve 122 and/or the exhaust valve 130 may be controlled by actuators other than a camshaft, such as electromechanical actuators, electrohydraulic actuators, electromagnetic actuators, etc.

The engine 102 may include zero, one, or more than one boost device that provides pressurized air to the intake manifold 110. For example, FIG. 1 shows a turbocharger including a turbocharger turbine 160-1 that is driven by exhaust gases flowing through the exhaust system 134. A supercharger is another type of boost device.

The turbocharger also includes a turbocharger compressor 160-2 that is driven by the turbocharger turbine 160-1 and that compresses air leading into the throttle valve 112. A wastegate 162 controls exhaust flow through and bypassing the turbocharger turbine 160-1. Wastegates can also be referred to as (turbocharger) turbine bypass valves. The wastegate 162 may allow exhaust to bypass the turbocharger turbine 160-1 to reduce intake air compression provided by the turbocharger. The ECM 114 may control the turbocharger via a wastegate actuator module 164. The wastegate actuator module 164 may modulate the boost of the turbocharger by controlling an opening of the wastegate 162.

A cooler (e.g., a charge air cooler or an intercooler) may dissipate some of the heat contained in the compressed air charge, which may be generated as the air is compressed. Although shown separated for purposes of illustration, the turbocharger turbine 160-1 and the turbocharger compressor 160-2 may be mechanically linked to each other, placing intake air in close proximity to hot exhaust. The compressed air charge may absorb heat from components of the exhaust system 134.

The engine 102 may include an exhaust gas recirculation (EGR) valve 170, which selectively redirects exhaust gas back to the intake manifold 110. The EGR valve 170 may receive exhaust gas from upstream of the turbocharger turbine 160-1 in the exhaust system 134. The EGR valve 170 may be controlled by an EGR actuator module 172.

Crankshaft position may be measured using a crankshaft position sensor 180. An engine speed may be determined based on the crankshaft position measured using the crankshaft position sensor 180. A temperature of engine coolant may be measured using an engine coolant temperature (ECT) sensor 182. The ECT sensor 182 may be located within the engine 102 or at other locations where the coolant is circulated, such as a radiator (not shown).

A pressure within the intake manifold 110 may be measured using a manifold absolute pressure (MAP) sensor 184. In various implementations, engine vacuum, which is the difference between ambient air pressure and the pressure within the intake manifold 110, may be measured. A mass flow rate of air flowing into the intake manifold 110 may be measured using a mass air flow (MAF) sensor 186. In various implementations, the MAF sensor 186 may be located in a housing that also includes the throttle valve 112.

Position of the throttle valve 112 may be measured using one or more throttle position sensors (TPS) 190. A temperature of air being drawn into the engine 102 may be measured using an intake air temperature (IAT) sensor 192. One or more other sensors 193 may also be implemented. The other sensors 193 include an accelerator pedal position (APP) sensor, a brake pedal position (BPP) sensor, may include a clutch pedal position (CPP) sensor (e.g., in the case of a manual transmission), and may include one or more other types of sensors. An APP sensor measures a position of an accelerator pedal within a passenger cabin of the vehicle. A BPP sensor measures a position of a brake pedal within a passenger cabin of the vehicle. A CPP sensor measures a position of a clutch pedal within the passenger cabin of the vehicle. The other sensors 193 may also include one or more acceleration sensors that measure longitudinal (e.g., fore/aft) acceleration of the vehicle and latitudinal acceleration of the vehicle. An accelerometer is an example type of acceleration sensor, although other types of acceleration sensors may be used. The ECM 114 may use signals from the sensors to make control decisions for the engine 102.

The ECM 114 may communicate with a transmission control module 194, for example, to coordinate engine operation with gear shifts in a transmission 195. The ECM 114 may communicate with a hybrid control module 196, for example, to coordinate operation of the engine 102 and a motor generator unit (MGU) 198. While the example of one MGU is provided, multiple MGUs and/or electric motors may be implemented. The terms MGU and electric motor may be interchangeable in the context of the present application, drawings, and claims. In various implementations, various functions of the ECM 114, the transmission control module 194, and the hybrid control module 196 may be integrated into one or more modules.

Each system that varies an engine parameter may be referred to as an engine actuator. Each engine actuator has an associated actuator value. For example, the throttle actuator module 116 may be referred to as an engine actuator, and the throttle opening area may be referred to as the actuator value. In the example of FIG. 1, the throttle actuator module 116 achieves the throttle opening area by adjusting an angle of the blade of the throttle valve 112.

The spark actuator module 126 may also be referred to as an engine actuator, while the corresponding actuator value may be the amount of spark advance relative to cylinder TDC. Other engine actuators may include the cylinder actuator module 120, the fuel actuator module 124, the phaser actuator module 158, the wastegate actuator module 164, and the EGR actuator module 172. For these engine actuators, the actuator values may correspond to a cylinder activation/deactivation sequence, fueling rate, intake and exhaust cam phaser angles, target wastegate opening, and EGR valve opening, respectively.

The ECM 114 may control the actuator values in order to cause the engine 102 to output torque based on a torque request. The ECM 114 may determine the torque request, for example, based on one or more driver inputs, such as an APP, a BPP, a CPP, and/or one or more other suitable driver inputs. The ECM 114 may determine the torque request, for example, using one or more functions or lookup tables that relate the driver input(s) to torque requests.

Under some circumstances, the hybrid control module 196 controls the MGU 198 to output torque, for example, to supplement engine torque output. The hybrid control module 196 may also control the MGU 198 to output torque for vehicle propulsion at times when the engine 102 is shut down.

The hybrid control module 196 applies electrical power from a battery 199 to the MGU 198 to cause the MGU 198 to output positive torque. While the example of the battery 199 is provided, more than one battery may be used to supply power to the MGU 198. The MGU 198 may output torque, for example, to the engine 102, to an input shaft of the transmission 195, to an output shaft of the transmission 195, or to another torque transfer device of the powertrain of the vehicle. The battery 199 may be dedicated for the MGU 198 and one or more other batteries may supply power for other vehicle functions.

Under other circumstances, the hybrid control module 196 may control the MGU 198 to convert mechanical energy of the vehicle into electrical energy. The hybrid control module 196 may control the MGU 198 to convert mechanical energy into electrical energy, for example, to recharge the battery 199. This may be referred to as regeneration.

Figure 2:
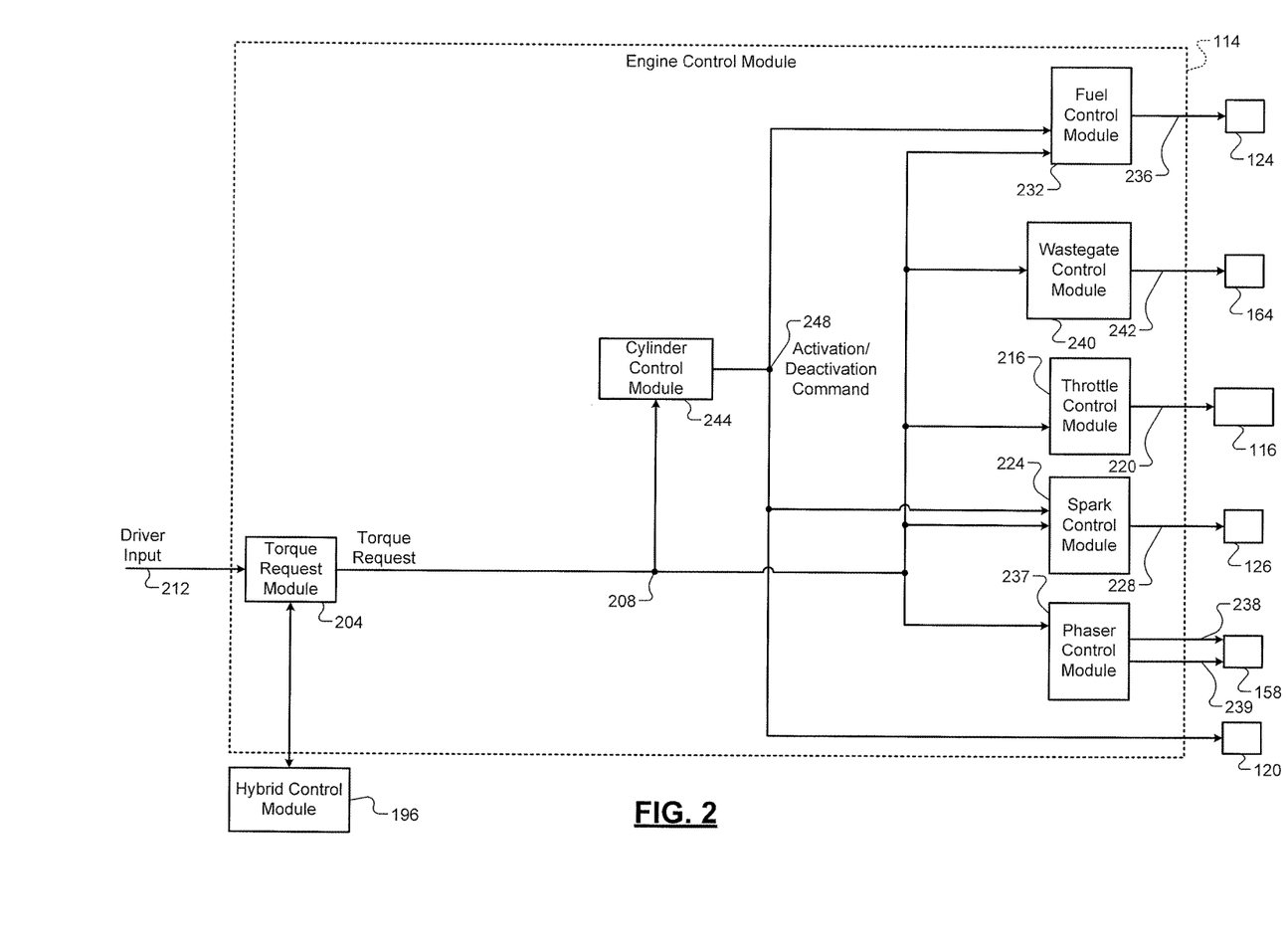
FIG. 2 is a functional block diagram of an example engine control system.

Referring now to FIG. 2, a functional block diagram of an example engine control system is presented. A torque request module 204 determines a torque request 208 for the engine 102 based on one or more driver inputs 212. The driver inputs 212 may include, for example, an accelerator pedal position, a brake pedal position, a cruise control input, and/or one or more other suitable driver inputs. For example, the torque request 208 may increase as the APP increases (relative to a predetermined resting APP) and vice versa. The torque request module 204 may determine the torque request 208 additionally or alternatively based on one or more other torque requests, such as torque requests generated by the ECM 114 and/or torque requests received from other modules of the vehicle, such as the transmission control module 194, the hybrid control module 196, a chassis control module, etc.

The ECM 114 controls one or more engine actuators based on the torque request 208 and/or one or more other parameters. For example, a throttle control module 216 may determine a target throttle opening 220 based on the torque request 208. The throttle actuator module 116 may adjust opening of the throttle valve 112 based on the target throttle opening 220.

A spark control module 224 determines a target spark timing 228 based on the torque request 208. The spark actuator module 126 generates spark based on the target spark timing 228. A fuel control module 232 determines one or more target fueling parameters 236 based on the torque request 208. For example, the target fueling parameters 236 may include a target equivalence ratio (EQR), number of fuel injections per combustion event, and timing for each of the injections. The fuel actuator module 124 injects fuel based on the target fueling parameters 236.

A phaser control module 237 determines target intake and exhaust cam phaser angles 238 and 239 based on the torque request 208. The phaser actuator module 158 may regulate the intake and exhaust cam phasers 148 and 150 based on the target intake and exhaust cam phaser angles 238 and 239, respectively.

A wastegate control module 240 sets a target wastegate opening 242 based on the torque request 208. The wastegate actuator module 164 controls opening of the wastegate 162 based on the target wastegate opening 242. For example only, the wastegate actuator module 164 may determine a target duty cycle (DC) to apply to the wastegate 162 based on the target wastegate opening 242 using a function or mapping that relates target wastegate openings to target DCs. The wastegate actuator module 164 may apply a signal to the wastegate 162 based on the target DC.

A cylinder control module 244 generates cylinder activation/deactivation commands 248 based on the torque request 208. The cylinder actuator module 120 deactivates the intake and exhaust valves of the cylinders based on the activation/deactivation commands 248.

The fuel control module 232 halts fueling of deactivated cylinders. The fuel control module 232 sets the target fueling parameters 236 to provide fuel to activated cylinders. The spark control module 224 may provide spark to activated cylinders and may provide or halt spark to deactivated cylinders.

Cylinder deactivation is different than fuel cutoff (e.g., deceleration fuel cutoff). When a cylinder is deactivated, the cylinder's intake and exhaust valves are maintained closed. When fuel is cutoff to a cylinder, the cylinder's intake and exhaust valves may still be opened and closed. The fuel control module 232 may cutoff fuel to one, more than one, or all of the cylinders of the engine, for example, during vehicle deceleration. This may decrease fuel consumption of the engine 102.

Referring back to FIG. 1, the vehicle also includes an audio control module 300 that controls sound output via speakers 304 within the passenger cabin of the vehicle. The audio control module 300 may control the speakers 304 to output sound based on received amplitude modulation (AM) signals, received frequency modulation (FM) signals, received satellite signals, and other types of audio signals. The audio control module 300 may be implemented, for example, with an infotainment system.

Under some circumstances, the audio control module 300 additionally or alternatively controls the sound output via the speakers 304 during deceleration. As discussed above, fuel to one or more cylinders of the engine 102 may be cutoff during deceleration. The engine 102 may therefore not emit some of the normal sounds (e.g., popping and/or burbling) that a driver may expect during deceleration. The audio control module 300 may control sound output via the speakers 304 to replicate some of the normal sounds that the driver may expect during deceleration.

The audio control module 300 may receive parameters from the ECM 114, the hybrid control module 196, the transmission control module 194, and/or one or more other control modules of the vehicle. The audio control module 300 may receive parameters from other modules, for example, via a car area network (CAN) bus. As discussed further below, the audio control module 300 may determine when and the extent to which to output sound during deceleration based on one or more of the received parameters.

Figure 3:
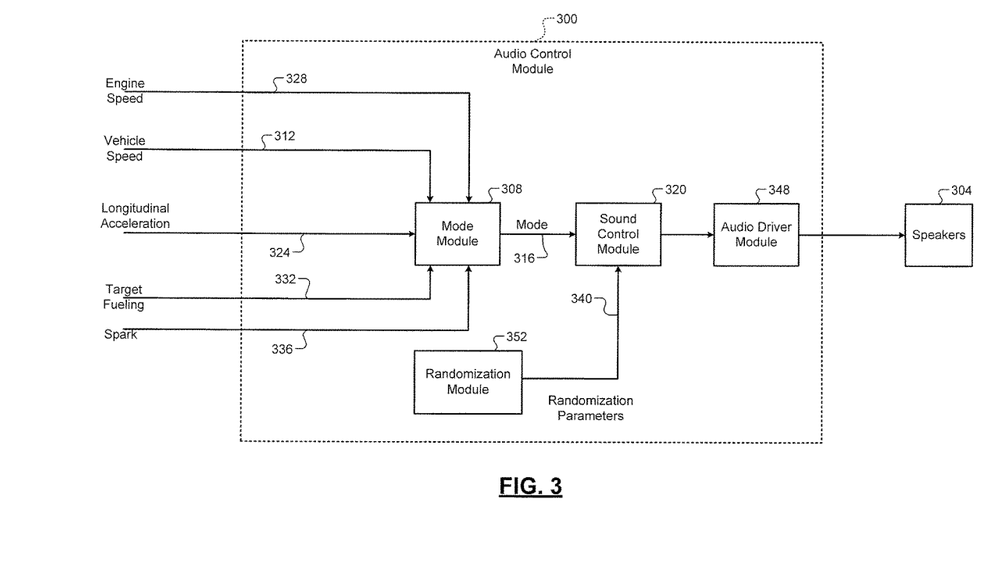
FIG. 3 is a functional block diagram of an example audio system including an audio control module and speakers.
Figure 4A:
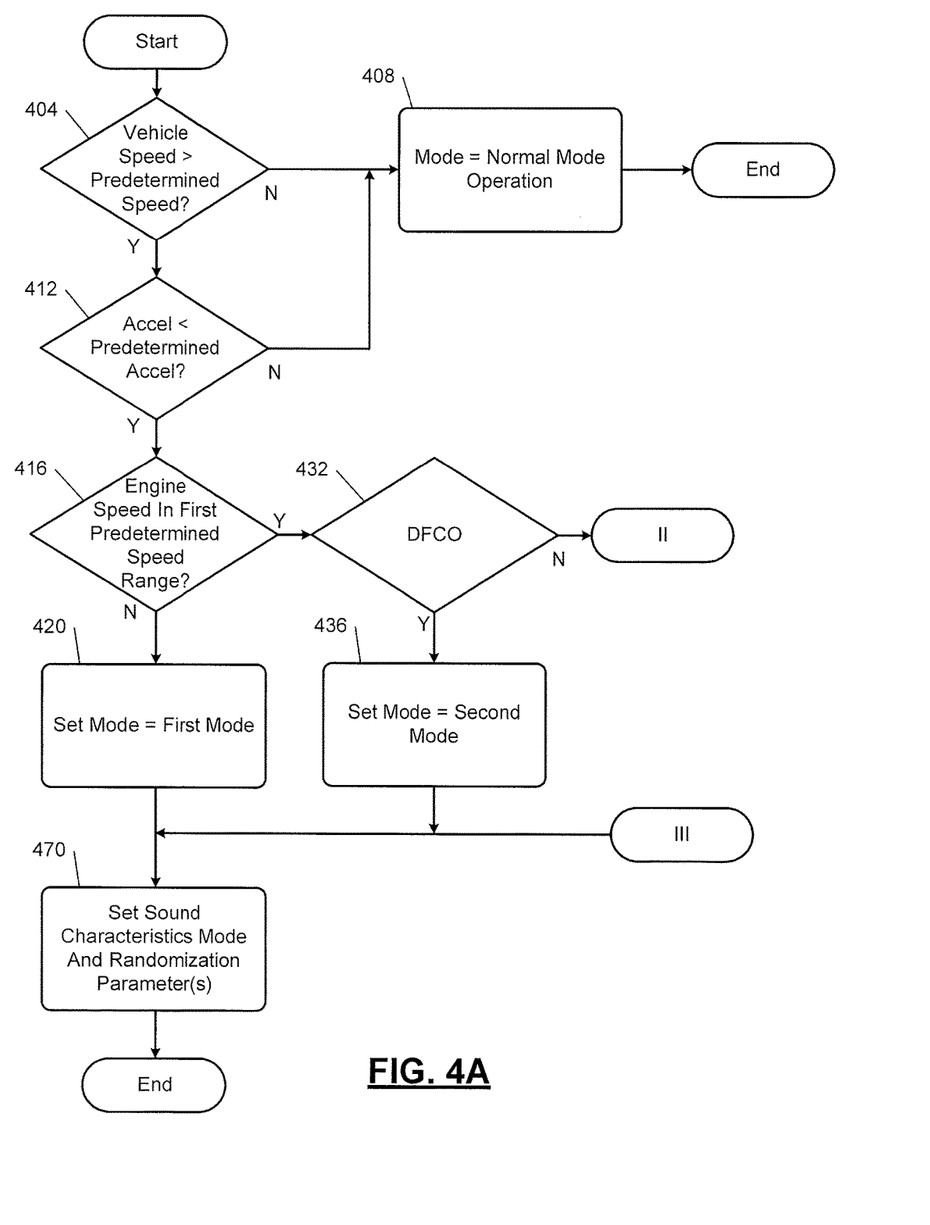
FIGS. 4A and 4B are collectively a flowchart depicting an example method of generating sound within a passenger cabin for a deceleration event of a vehicle.
Figure 4B:
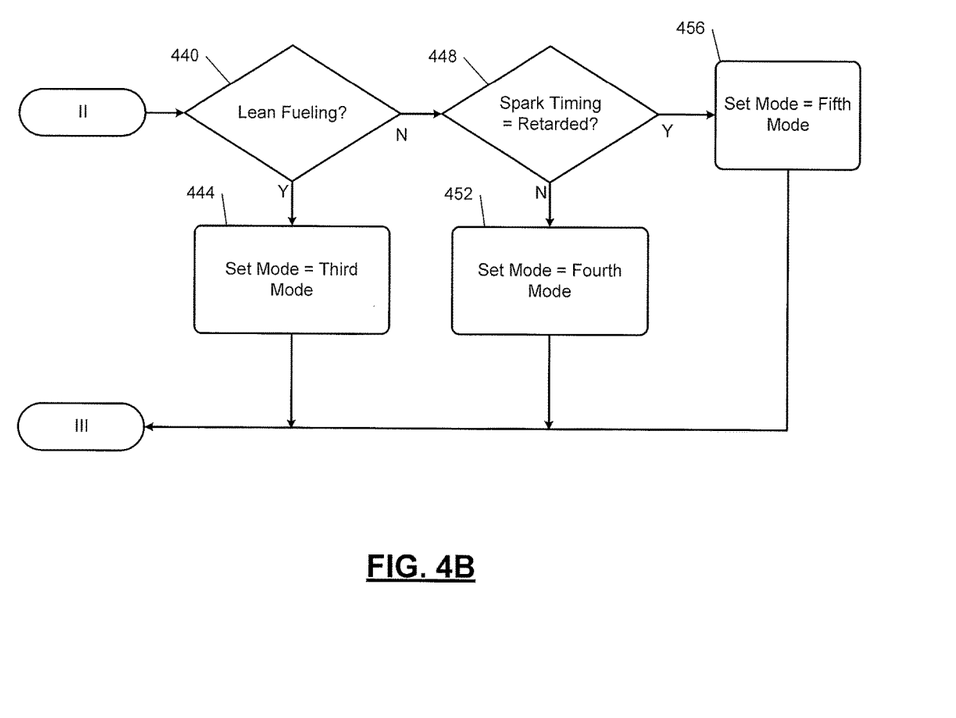

FIG. 3 is a functional block diagram of an example audio system including the audio control module 300 and the speakers 304. The speakers 304 output sound within the passenger cabin of the vehicle. FIGS. 4A and 4B are collectively a flowchart depicting an example method of generating sound for deceleration events. FIGS. 3, 4A, and 4B will now be described collectively where reference numerals beginning with 3 refer to FIG. 3 while reference numerals beginning with 4 refer to FIG. 4A or FIG. 4B.

Control begins with 404 where a mode module 308 determines whether a vehicle speed 312 is greater than a predetermined speed. If 404 is false, the mode module 308 sets a mode 316 to a normal mode at 408, and control may end. A sound control module 320 may set characteristics of sound to be output via the speakers 304 based on operation in the normal mode. If 404 is true, control continues with 412. The predetermined speed may be calibratable and is a positive value. For example only, the predetermined speed may be greater than or equal to approximately 50 miles per hour (mph), 60 mph, 70 mph, 80 mph, 90 mph, or another suitable speed. The vehicle speed 312 may be determined based on one or more wheel speeds of the vehicle measured using wheel speed sensor(s), respectively. The audio control module 300 may receive the vehicle speed 312, for example, from the ECM 114, the transmission control module 194, or another module via the CAN bus.

At 412, the mode module 308 may determine whether a longitudinal acceleration 324 of the vehicle (e.g., in the forward direction) is less than (i.e., more negative than) a predetermined acceleration. The predetermined acceleration may be calibratable and is a negative value (i.e., indicative of vehicle deceleration in the forward direction). The predetermined acceleration may be, for example, approximately −0.2 g or another suitable value. The longitudinal acceleration 324 of the vehicle may be measured using one or more longitudinal acceleration sensors. The audio control module 300 may receive the longitudinal acceleration 324, for example, from the ECM 114, the transmission control module 194, or another module via the CAN bus. If 412 is true, control may continue with 416. If 412 is false, control may transfer to 408 for normal mode operation, as discussed above.

The mode module 308 may determine whether an engine speed 328 is within a predetermined speed range at 416. The predetermined speed may be calibratable. For example only, the predetermined speed range may be defined by (i) a predetermined speed that is greater than an idle speed of the engine 102 and (ii) a predetermined maximum engine speed. While the example of only 1 predetermined engine speed range is provided, the present application is also applicable to the use of multiple predetermined engine speed ranges. Other predetermined engine speed ranges may have functions that are similar or identical to those discussed below regarding 432-456. If 416 is false, the mode module 308 sets the mode 316 to a first mode at 420, and control continues with 470, which is discussed further below. If 416 is true, control continues with 432.

At 432, the mode module 308 determines whether the engine 102 is operating in deceleration fuel cutoff (DFCO) where fuel to one, more than 1, or all of the cylinders of the engine 102 is cutoff. If 432 is true, the mode module 308 sets the mode 316 to a second mode at 436, and control continues with 470, which is discussed further below. If 432 is false, control transfers to 440 of FIG. 4B. The ECM 114 may indicate to the audio control module 300 whether the engine 102 is operating in DFCO.

Referring now to FIGS. 3 and 4B, at 440, the mode module 308 determines whether fueling of the engine 102 is (fuel) lean. For example, the mode module 308 may determine whether a target equivalence ratio (EQR) 332 used to set the target fueling parameters 236 is less than 1.0. The ECM 114 may provide the target EQR 332. An EQR of 1.0 corresponds to a stoichiometric air/fuel mixture. While the examples of EQR and 1.0 are provided, another suitable parameter indicative of whether fueling of the engine 102 is lean or rich (e.g., lambda, air/fuel ratio, etc.) and/or a slightly fuel lean predetermined value may be used. If 440 is true, the mode module 308 may set the mode 316 to a third mode at 444, and control may continue with 470, which is discussed further below. If 440 is false, control may transfer to 448.

At 448, the mode module 308 may determine whether a spark timing 336 of the engine 102 is retarded, such as relative to a predetermined spark timing set for the present engine operating parameters. The spark timing 336 may be, for example, the target spark timing 228 and may be provided by the ECM 114. If 448 is false (meaning that the spark timing is advanced), the mode module 308 may set the mode 316 to a fourth mode at 452, and control may continue with 470, which is discussed further below. If 448 is true, the mode module 308 may set the mode 316 to a fifth mode at 456, and control may continue with 470, which is discussed further below.

At 470, the sound control module 320 sets characteristics for sound output via the speakers 304 based on the mode 316 and/or one or more randomization parameters 340. An audio driver module 348 applies power (e.g., from the one or more other batteries) to the speakers 304 to output sound, according to the output of the sound control module 320, via the speakers 304.

Figure 6:
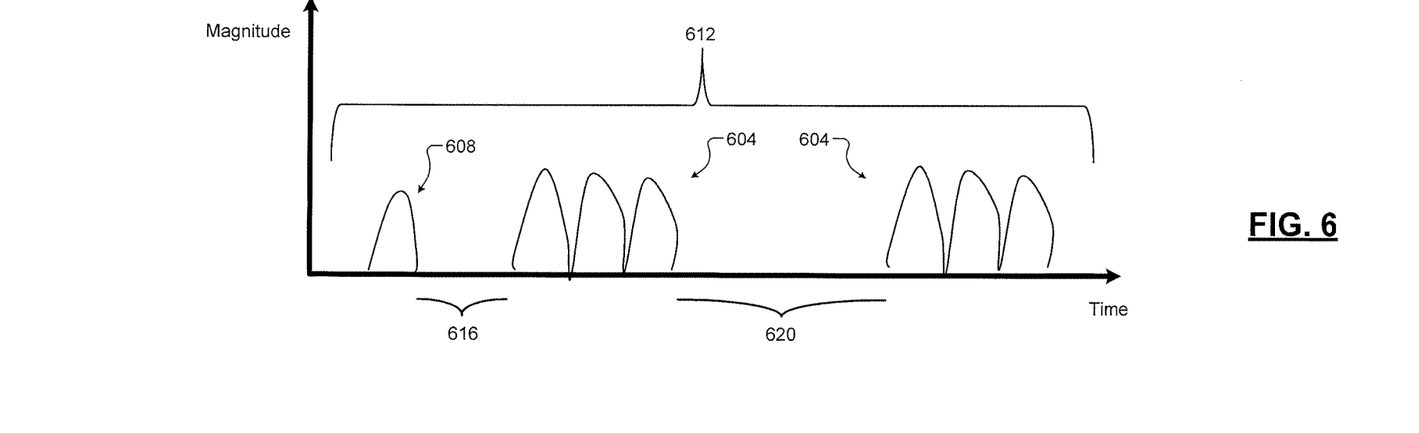
FIG. 6 includes example graph of magnitude versus time of sounds created to replicate an engines natural pop and burble during a deceleration event.

For example, when the mode 316 is set to the first mode, the sound control module 320 may set the sound characteristics to output a predetermined burble sound at a first predetermined magnitude at a first predetermined rate. The first predetermined magnitude and the first predetermined rate may be set to lower than and less than other predetermined magnitudes and predetermined rates, as discussed further below. As such, when the mode 316 is set to the first mode, the audio driver module 348 may apply power to the speakers 304 to output the predetermined burble sound relatively quietly and with relatively large periods between consecutive predetermined burble sounds. The predetermined burble sound may correspond to a series of two or more (e.g., three) sounds (e.g., exhaust pressure rises) and may be calibrated to replicate fuel combustion within the exhaust system that may occur during deceleration. An example illustration of pressure rises corresponding to an example of the predetermined burble sound are illustrated by 604 in FIG. 6. FIG. 6 is an example graph of magnitude of sounds output over time.

When the mode 316 is set to the second mode, the sound control module 320 may set the sound characteristics to output the predetermined burble sound at the first predetermined magnitude at the first predetermined rate. The sound control module 320 may also set the sound characteristics to periodically and non-randomly output one or more predetermined pop sounds. The predetermined pop sound may correspond to one sound (e.g., exhaust pressure rise) and may be calibrated to replicate fuel combustion within the exhaust system that may occur during deceleration. An example illustration of one pressure rise corresponding to an example of the predetermined pop sound is illustrated by 608 in FIG. 6.

When the mode 316 is set to the third mode, the sound control module 320 may set the sound characteristics to output the predetermined burble sound at the first predetermined magnitude and at a second predetermined rate. The second predetermined rate may be faster (i.e., more frequent) than the first predetermined rate. As such, when the mode 316 is set to the third mode, the audio driver module 348 may apply power to the speakers 304 to output the predetermined burble sound relatively quietly but with relatively smaller periods between consecutive predetermined burble sounds.

When the mode 316 is set to the fourth mode, the sound control module 320 may set the sound characteristics to output the predetermined burble sound at a second predetermined magnitude and at a third predetermined rate. The third predetermined rate may be the same as or faster than the second predetermined rate. The second predetermined magnitude may be greater than the first predetermined magnitude. When the mode 316 is set to the fourth mode, the sound control module 320 may also set the sound characteristics to output the predetermined pop sound at the first predetermined magnitude and at a fourth predetermined rate. The fourth predetermined rate may be less than the third predetermined rate. As such, the audio driver module 348 may apply power to the speakers 304 to output the predetermined burble sound relatively more loudly and with relatively smaller periods between consecutive predetermined burble sounds and to also output the predetermined pop sound relatively quietly.

When the mode 316 is set to the fifth mode, the sound control module 320 may set the sound characteristics to output the predetermined burble sound and the predetermined pop sound based on the randomization parameters 340. For example, based on the randomization parameters 340, the sound control module 320 may set one, more than one, or all of: (i) the number of sounds used to create the predetermined burble sound, (ii) a total period of each predetermined burble sound (e.g., between a start of the first one of the sounds and an end of the last one of the sounds), (iii) the magnitude of each sound (e.g., predetermined pop sound and/or sound of the predetermined burble sound), (iv) the magnitude of all of the sounds of a predetermined burble sound, (v) a total number of sounds to (sounds of predetermined pop sounds plus sounds of predetermined burble sounds), (vi) a periodic rate of beginnings of successive predetermined (pops and burble) sounds, (vii) periods between the end of one predetermined sound and the beginning of the next predetermined sound, (viii) a number of predetermined pop sounds and/or a number of predetermined burble sounds to output.

A randomization module 352 provides the randomization parameters 340, for example, based on a Chaos function or another suitable randomization function. One example Chaos function is a double pendulum Chaos function, although another type of randomization function may be used.

The randomization module 352 may execute the randomization function and provide the randomization parameters 340 during vehicle operation. Alternatively, a randomization equation may be executed during vehicle design, and a predetermined number of sets of the resulting randomization parameters may be stored in memory. A set of these stored parameters may be retrieved for each control loop during operation in the fifth mode and used as the randomization parameters 340. A set may be selected out of all of the sets, for example, in a predetermined order or randomly.

Figure 5:
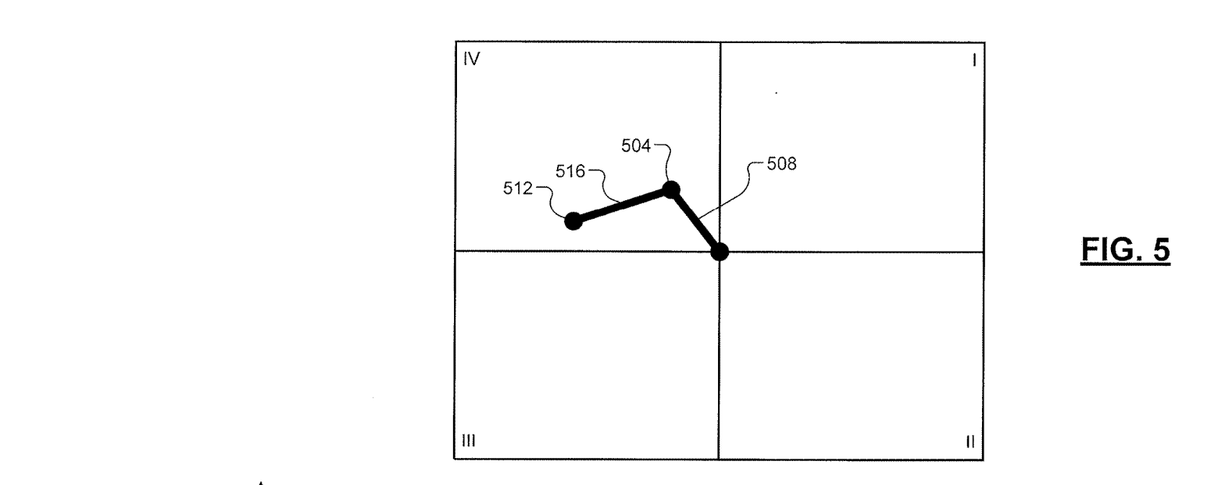
FIG. 5 includes an example coordinate system and one example position of a double pendulum of a randomization equation, such as a Chaos equation.

FIG. 5 includes an example coordinate system and one example position of a double pendulum of a Chaos function. The double pendulum moves randomly within the circle defined by a radius of the double pendulum based on the Chaos function. One or more characteristics of the double pendulum may be used as the randomization parameters 340.

For example, the sound control module 320 may determine a total number of sounds to output during a predetermined period based on a first endpoint 504 of a first section 508 of the double pendulum. The sound control module 320 may determine the total number of sounds, for example, using an equation or a lookup table that relates first endpoints to total numbers of sounds. An example predetermined period is illustrated by 612 in FIG. 6. The sound control module 320 may determine the predetermined period, for example, based on the mode 316 and/or one or more present operating parameters.

The sound control module 320 may determine the magnitude of one, more than one, or all of the sounds to be output based on a second endpoint 512 of a second section 516 of the double pendulum. The sound control module 320 may determine the magnitude, for example, using an equation or a lookup table that relates second endpoints to magnitude. While the example of a double pendulum is provided, a pendulum having a greater number of sections, another Chaos function, or another randomization function may be used may be used.

The example of FIG. 5 includes a coordinate system including 4 quadrants labeled I, II, III, and IV. The sound control module 320 may determine how many predetermined burble sounds and how many predetermined pop sounds to output based on which quadrant the second endpoint 512 is in. The sound control module 320 may make this determination, for example, using a lookup table that related quadrants to numbers of predetermined burble sounds and predetermined pop sounds. For example, the sound control module 320 may determine to output one predetermined pop sound followed by two of the predetermined burble sounds for quadrant IV. This example of one predetermined pop sound followed by two predetermined burble sounds is illustrated in the example of FIG. 6. The sound control module 320 may determine to output one predetermined pop sound for quadrant III. The sound control module 320 may determine to output one predetermined burble sound for quadrant I. The sound control module 320 may determine to output one predetermined pop sound followed by three of the predetermined burble sounds for quadrant II. While these examples are provided, other examples are also possible. Also, while the example of quadrants is provided, another suitable coordinate system division may be used.

The sound control module 320 may determine one or more parameters based on one or more dynamic parameters of one or more sections of the double pendulum. For example, the sound control module 320 may determine a periodic rate between beginnings of successive sounds (e.g., predetermined pop or predetermined burble sounds) and/or a length of a period of silence after each predetermined type of sound based on an angular velocity of an endpoint. In the example of FIG. 6, a short period 616 of silence is provided after the predetermined pop sound 608 while a slightly longer period 620 of silence is provided after the first predetermined burble sound 604. While the example of FIGS. 4A and 4B illustrates one control loop, control may return to 404.

Outputting sound during deceleration events may replicate the sound that a driver may expect the engine 102 to produce during deceleration, despite the fact that the engine 102 may not produce the expected sound, for example, to decrease fuel consumption. The randomization of the sounds may also be perceived by the driver as natural engine sound instead of artificial sound.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. An audio system of a vehicle, comprising:
   a mode module that sets a mode signal to a first mode when a vehicle speed is greater than a predetermined speed and a longitudinal acceleration of the vehicle is less than a predetermined acceleration,
   wherein the predetermined acceleration is less than zero and the predetermined speed is greater than zero,
   a sound control module that, when the mode signal is in the first mode, selectively sets audio characteristics for a deceleration event of the vehicle based on randomization parameters; and
   an audio driver module that, based on the audio characteristics, applies power to speakers to output sound within a passenger cabin of the vehicle.

2. The audio system of claim 1 wherein the mode module sets the mode signal to the first mode when all of: (i) the vehicle speed is greater than the predetermined speed, (ii) the longitudinal acceleration is less than the predetermined acceleration, (iii) fueling of an internal combustion engine is fuel rich, and (vi) a spark timing of the internal combustion engine is retarded relative to a predetermined spark timing.

3. The audio system of claim 2 wherein:
   (A) the mode module sets the mode signal to a second mode when:
      (i) the vehicle speed is greater than the predetermined speed;
      (ii) the longitudinal acceleration is less than the predetermined acceleration; and
      (iii) at least one of:
         (a) fueling of the internal combustion engine is cut off;
         (b) the spark timing is not retarded relative to the predetermined spark timing; and
         (c) fueling of the internal combustion engine is not fuel rich; and
   (B) the sound control module that, when the mode signal is in the second mode, selectively sets the audio characteristics for the deceleration event of the vehicle based on both (i) the randomization parameters and (ii) the mode signal being in the second mode.

4. The audio system of claim 1 wherein the audio characteristics include at least:
   a first number of instances to output a first predetermined sound during a predetermined period; and
   a second number of instances to output a second predetermined sound during the predetermined period,
   wherein the sound control module determines the first and second numbers based on at least one of the randomization parameters.

5. The audio system of claim 4 further comprising:
   a randomization module that provides the randomization parameters based on a Chaos function.

6. The audio system of claim 1 wherein the audio characteristics include at least a total number of predetermined sounds to output per predetermined period and, wherein the sound control module determines the total number of predetermined sounds to output per predetermined period based on at least one of the randomization parameters.

7. The audio system of claim 1 wherein the audio characteristics include at least a silence period between two successive predetermined sounds, and
the sound control module determines the silence period based on at least one of the randomization parameters.

8. The audio system of claim 1 wherein the audio characteristics include at least a magnitude to output each predetermined sound during a predetermined period,
wherein the sound control module determines the magnitude based on at least one of the randomization parameters.

9. The audio system of claim 1 wherein the audio characteristics include a number and an order to output two or more predetermined sounds during a predetermined period,
wherein the sound control module determines the number and the order based on at least one of the randomization parameters.

10. The audio system of claim 9 wherein the two or more predetermined sounds include at least:
a first predetermined sound corresponding to one exhaust pressure rise; and
a second predetermined sound corresponding to a series of two or more exhaust pressure rises.

11. A vehicle audio system, comprising:
at least one memory comprising computer executable instructions;
at least one processor configured to read and execute the computer executable instructions, the computer executable instructions causing the at least one processor to:
set a mode signal to a first mode when a vehicle speed is greater than a predetermined speed and a longitudinal acceleration of the vehicle is less than a predetermined acceleration,
wherein the predetermined acceleration is less than zero and the predetermined speed is greater than zero;
when the mode signal is in the first mode, selectively set audio characteristics for a deceleration event of the vehicle based on randomization parameters; and,
based on the audio characteristics, apply power to speakers to output sound within a passenger cabin of the vehicle.

12. A non-transitory computer readable medium comprising computer executable instructions, the computer executable instructions configured to cause a processor to perform a method, the method comprising:
setting a mode signal to a first mode when a vehicle speed is greater than a predetermined speed and a longitudinal acceleration of the vehicle is less than a predetermined acceleration,
wherein the predetermined acceleration is less than zero and the predetermined speed is greater than zero;
when the mode signal is in the first mode, selectively setting audio characteristics for a deceleration event of the vehicle based on randomization parameters; and,
based on the audio characteristics, applying power to speakers to output sound within a passenger cabin of the vehicle.

13. The non-transitory computer readable medium of claim 12, wherein setting the mode signal to the first mode includes setting the mode signal to the first mode when all of:
(i) the vehicle speed is greater than the predetermined speed;
(ii) the longitudinal acceleration is less than the predetermined acceleration;
(iii) fueling of an internal combustion engine is fuel rich; and
(vi) a spark timing of the internal combustion engine is retarded relative to a predetermined spark timing.

14. The non-transitory computer readable medium of claim 13, the method further comprising:
(A) setting the mode signal to a second mode when:
(i) the vehicle speed is greater than the predetermined speed;
(ii) the longitudinal acceleration is less than the predetermined acceleration; and
(iii) at least one of:
(a) fueling of the internal combustion engine is cut off;
(b) the spark timing is not retarded relative to the predetermined spark timing; and
(c) fueling of the internal combustion engine is not fuel rich; and
(B) when the mode signal is in the second mode, selectively setting the audio characteristics for the deceleration event of the vehicle based on both (i) the randomization parameters and (ii) the mode signal being in the second mode.

15. The non-transitory computer readable medium of claim 12 wherein the audio characteristics include at least:
a first number of instances to output a first predetermined sound during a predetermined period; and
a second number of instances to output a second predetermined sound during the predetermined period,
the method further comprising determining the first and second numbers based on at least one of the randomization parameters.

16. The non-transitory computer readable medium of claim 12, the method further comprising:
obtaining the randomization parameters based on a Chaos function.

17. The non-transitory computer readable medium of claim 12 wherein the audio characteristics include at least a total number of predetermined sounds to output per predetermined period and,
wherein the method further comprising determining the total number of predetermined sounds to output per predetermined period based on at least one of the randomization parameters.

18. The non-transitory computer readable medium of claim 12 wherein the audio characteristics include at least a silence period between two successive predetermined sounds, and
the method further comprising determining the silence period based on at least one of the randomization parameters.

19. The non-transitory computer readable medium of claim 12 wherein the audio characteristics include at least a magnitude to output each predetermined sound during a predetermined period,
the method further comprising determining the magnitude based on at least one of the randomization parameters.

20. The non-transitory computer readable medium of claim 12 wherein the audio characteristics include a number and an order to output two or more predetermined sounds during a predetermined period, the method further comprising determining the number and the order based on at least one of the randomization parameters.

\* \* \* \* \*